(12) United States Patent
Ballas et al.

(10) Patent No.: US 8,499,629 B2
(45) Date of Patent: Aug. 6, 2013

(54) MOUNTING SYSTEM FOR TORSIONAL SUSPENSION OF A MEMS DEVICE

(75) Inventors: Gary Ballas, Redmond, WA (US); Galen Magendanz, Issaquah, WA (US)

(73) Assignee: Honeywell International Inc., Morristown, NJ (US)

(*) Notice: Subject to any disclaimer, the term of this patent is extended or adjusted under 35 U.S.C. 154(b) by 1144 days.

(21) Appl. No.: 12/249,681

(22) Filed: Oct. 10, 2008

(65) Prior Publication Data
US 2010/0089154 A1    Apr. 15, 2010

(51) Int. Cl.
*G01P 1/02* (2006.01)

(52) U.S. Cl.
USPC ............................................. 73/493

(58) Field of Classification Search
USPC ...... 73/493, 514.29, 514.16; 438/51; 257/414
See application file for complete search history.

(56) References Cited

U.S. PATENT DOCUMENTS

| | | | |
|---|---|---|---|
| 4,766,768 A * | 8/1988 | Norling et al. ............... | 73/497 |
| 5,580,815 A * | 12/1996 | Hsu et al. .................. | 438/362 |
| 6,000,287 A | 12/1999 | Menzel | |
| 6,121,552 A * | 9/2000 | Brosnihan et al. ........... | 174/253 |
| 6,170,332 B1 * | 1/2001 | MacDonald et al. ......... | 73/514.38 |
| 6,230,566 B1 * | 5/2001 | Lee et al. .................. | 73/514.32 |
| 6,342,430 B1 * | 1/2002 | Adams et al. ............... | 438/424 |
| 6,395,644 B1 * | 5/2002 | Hopper et al. ............... | 438/738 |
| 6,516,208 B1 | 2/2003 | Eden | |
| 6,686,638 B2 * | 2/2004 | Fischer et al. ............... | 257/415 |
| 6,770,506 B2 * | 8/2004 | Gogoi ........................ | 438/52 |
| 6,860,151 B2 * | 3/2005 | Platt et al. .................. | 73/504.16 |
| 6,876,877 B2 | 4/2005 | Eden | |
| 6,897,538 B2 | 5/2005 | Eskridge | |
| 6,914,316 B2 * | 7/2005 | Yun et al. .................. | 257/506 |
| 6,936,491 B2 * | 8/2005 | Partridge et al. ............ | 438/48 |
| 6,960,488 B2 * | 11/2005 | Brosnihan et al. ........... | 438/52 |
| 6,991,957 B2 | 1/2006 | Eskridge | |
| 7,053,736 B2 | 5/2006 | Nelson | |
| 7,210,352 B2 | 5/2007 | Foster et | |
| 7,260,051 B1 | 8/2007 | Culver | |
| 7,352,040 B2 * | 4/2008 | Partridge et al. ............ | 257/419 |
| 7,391,707 B2 | 6/2008 | Rust et al. | |
| 7,458,263 B2 * | 12/2008 | Nasiri et al. ................ | 73/504.12 |
| 7,539,003 B2 * | 5/2009 | Ray et al. ................... | 361/277 |
| 2002/0111031 A1 * | 8/2002 | Chase et al. ................ | 438/712 |
| 2002/0170355 A1 | 11/2002 | Malametz | |
| 2002/0189352 A1 | 12/2002 | Reeds, III et al. | |

(Continued)

OTHER PUBLICATIONS

Spiering et al; On-chip decoupling zone for package-stress reduction; MESA Research Institute and Faculty of Mechanical Engineering, University of Twent, (Netherlands); Accepted Apr. 27, 1993.

*Primary Examiner* — Peter Macchiarolo
*Assistant Examiner* — Samir M Shah
(74) *Attorney, Agent, or Firm* — Lowe Graham Jones PLLC

(57) ABSTRACT

A mounting system for a MEMS device includes a proof mass selectively coupled to a substrate using a centrally located, single anchor mount that minimizes sensitivity to strain variations experienced by the MEMS device. The mounting system may include isolation cuts arranged in the proof mass to advantageously achieve a desired amount of strain isolation and to produce hinges that extend in opposite directions from the anchor mount. The single anchor mount is arranged to reduce a separation distance from a mid-point or centroid of the anchor mount to its perimeter as compared to conventional mounting schemes that have multiple anchor mounts positioned distally from a common mid-point.

22 Claims, 3 Drawing Sheets

U.S. PATENT DOCUMENTS

| | | |
|---|---|---|
| 2003/0036214 A1 | 2/2003 | Eskridge |
| 2003/0140700 A1 | 7/2003 | Zarabadi et al. |
| 2003/0227348 A1 | 12/2003 | Eden |
| 2005/0202585 A1 | 9/2005 | Eskridge |
| 2006/0032310 A1 | 2/2006 | Merassi et al. |
| 2006/0148133 A1* | 7/2006 | Nunan et al. .................. 438/117 |
| 2006/0219006 A1* | 10/2006 | Nasiri et al. ................ 73/504.12 |
| 2006/0277997 A1 | 12/2006 | Foster et al. |
| 2007/0024156 A1 | 2/2007 | Li et al. |
| 2007/0090475 A1 | 4/2007 | Karnick et al. |
| 2007/0165444 A1 | 7/2007 | Culver et al. |
| 2007/0170525 A1 | 7/2007 | Eskridge |
| 2007/0268808 A1 | 11/2007 | Culver et al. |
| 2007/0279832 A1* | 12/2007 | Ray et al. ...................... 361/271 |
| 2008/0053229 A1* | 3/2008 | Gogoi et al. ................ 73/514.32 |
| 2008/0173091 A1 | 7/2008 | McNeil et al. |

* cited by examiner

MOUNTING SYSTEM FOR TORSIONAL SUSPENSION OF A MEMS DEVICE

BACKGROUND OF THE INVENTION

Micro ElectroMechanical Systems (MEMS) devices that are intended to be highly sensitive to a specific physical phenomena (e.g., acceleration) may also be highly sensitive to additional physical phenomena (e.g., temperature). By way of example, induced strains may take the form of thermal strains caused because of coefficient of thermal expansion (CTE) differences among the components comprising the MEMS device. Additionally or alternatively, the strains may take the form of residual stresses induced during the packaging or assembly process or take the form of environmentally driven changes (e.g., humidity, vibration, applied loads, etc.) in a strain state of one or more of the components. These strains, regardless of their origin, may introduce unwanted errors, such as bias, scale factor or axis alignment errors that affect the performance of the MEMS device.

One existing configuration for the MEMS device is to use a teeter-totter scheme to attach a proof mass to one or more sensing elements via a torsional hinge. The teeter-totter scheme utilizes multiple anchor points placed at finite distances apart from one another. Referring to FIG. 1, a conventional mounting system 10 for a MEMS device includes a proof mass 12 coupled to sensing elements (not shown) using a plurality of spaced apart mounting anchors 14 with each mounting anchor 14 having its own midpoint 16 that is located a distance "d1" from a midpoint 18 of the proof mass 12. By way of example, the distance "d1" is shown with respect to the midpoint 18 and the lower left mounting anchor 14 in the illustrated figure. The proof mass 12 includes a necked down region 20 that operates as a torsional hinge and possibly as a flexural hinge.

In the above-configuration, the strain may be directly proportional to the distance "d1," which will be referred to as the separation distance hereinafter, for each mounting anchor 14. During assembly, operation and possibly at other times, the multiple mounting anchors 14 may become asymmetrically arranged due to thermal or other types of strains induced into the MEMS device. For example, the strains may cause a small amount of displacement to one, but not all of the mounting anchors 14. This asymmetric displacement may occur because of straining within a bonding material attaching the mounting anchors 14 to the proof mass 12. In turn, such an asymmetric bond variance may manifest itself at the torsional hinge 20 and thereby cause an undesired, albeit small, rotational displacement of the proof mass 12 and/or may lead to erroneous static or dynamic motion of the active MEMS sensing element.

SUMMARY OF THE INVENTION

The present invention generally relates to a mounting system for a MEMS device and specifically relates to a centrally located, single (e.g., unitary or one-piece) mounting member arranged to couple a MEMS sensor to a proof mass. A purpose of the present invention is to support the active MEMS sensing element in a manner that minimizes sensitivity to changes in the strain state for the various components of the MEMS device, specifically changes in the strain state of the proof mass, the respective anchor point or points, and the bonding material used as an interface between the proof mass and the anchor member(s). The mounting system may include isolation cuts arranged in the proof mass to advantageously achieve a desired amount of strain isolation, a desired system frequency, a desired system stiffness, or other component or system properties.

In one aspect of the invention, a mounting system for providing torsional and flexural suspension of a MEMS device includes a proof mass; a plurality of isolation cuts selectively arranged in the proof mass; and an anchor mounting member having a first surface bonded to a sensor substrate and a second surface bonded to the proof mass, the anchor mounting member centrally located relative to a centerline of the proof mass.

In another aspect of the invention, a mounting system for providing torsional and flexural suspension of a MEMS device includes a proof mass; a plurality of isolation cuts selectively arranged in the proof mass; and a one-piece anchor mounting member having a first portion coupled to a sensor substrate and a second portion coupled to the proof mass.

In yet another aspect of the invention, a MEMS device includes a sensor element; a proof mass; a plurality of isolation cuts selectively arranged in the proof mass; and an anchor mounting member having a first surface bonded to the sensor element and a second surface bonded to the proof mass, the anchor mounting member centrally located relative to a centerline of the proof mass.

BRIEF DESCRIPTION OF THE DRAWINGS

Preferred and alternative embodiments of the present invention are described in detail below with reference to the following drawings.

DETAILED DESCRIPTION OF ONE EMBODIMENT

Figure 2:
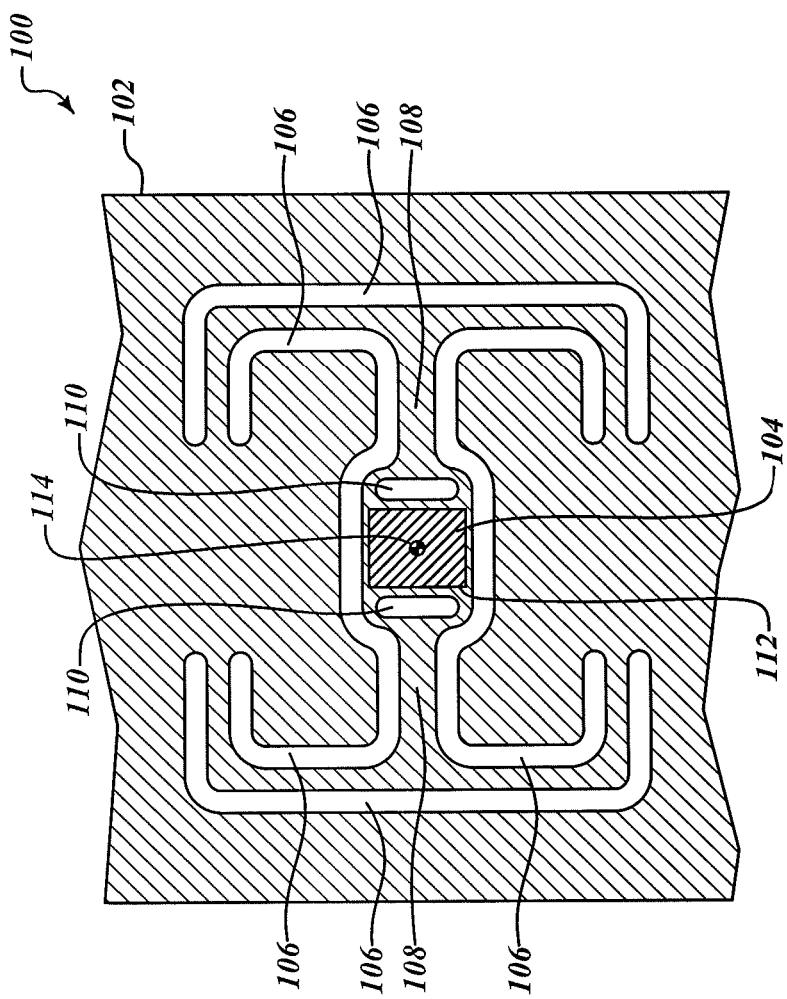
FIG. 2 is a plan view of a mounting system utilized in a MEMS device for mounting a proof mass to an active MEMS sensing element according to an embodiment of the present invention.
Figure 3:
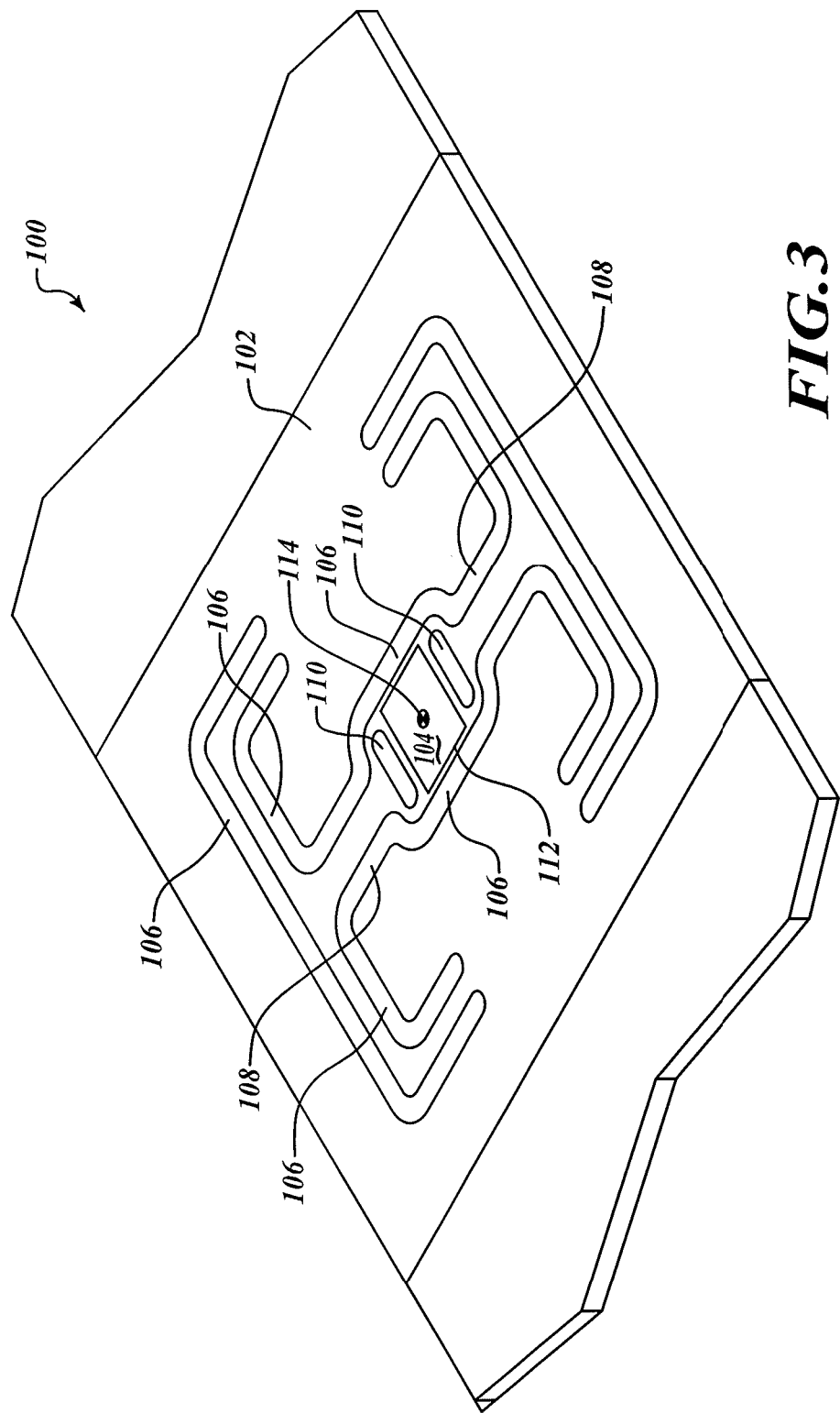
FIG. 3 is an isometric view of the mounting system of FIG. 3.

FIGS. 2 and 3 show a mounting system 100 for a MEMS device having a proof mass (or sensing element) 102 coupled to a fixed substrate (not shown) using a single (e.g., unitary or one-piece) mounting anchor 104 according to an illustrated embodiment. A number of first isolation cuts 106 may be symmetrically arranged thereon to achieve a desired amount of stiffness for the proof mass 102 and in particular to achieve a desired amount of stiffness for a pair of hinges 108, which may operate as both torsional and flexural hinges, extending in opposite directions from the mounting anchor 104. In one embodiment, a pair of second isolation cuts 110 may be positioned adjacent the mounting anchor 104.

Figure 1:
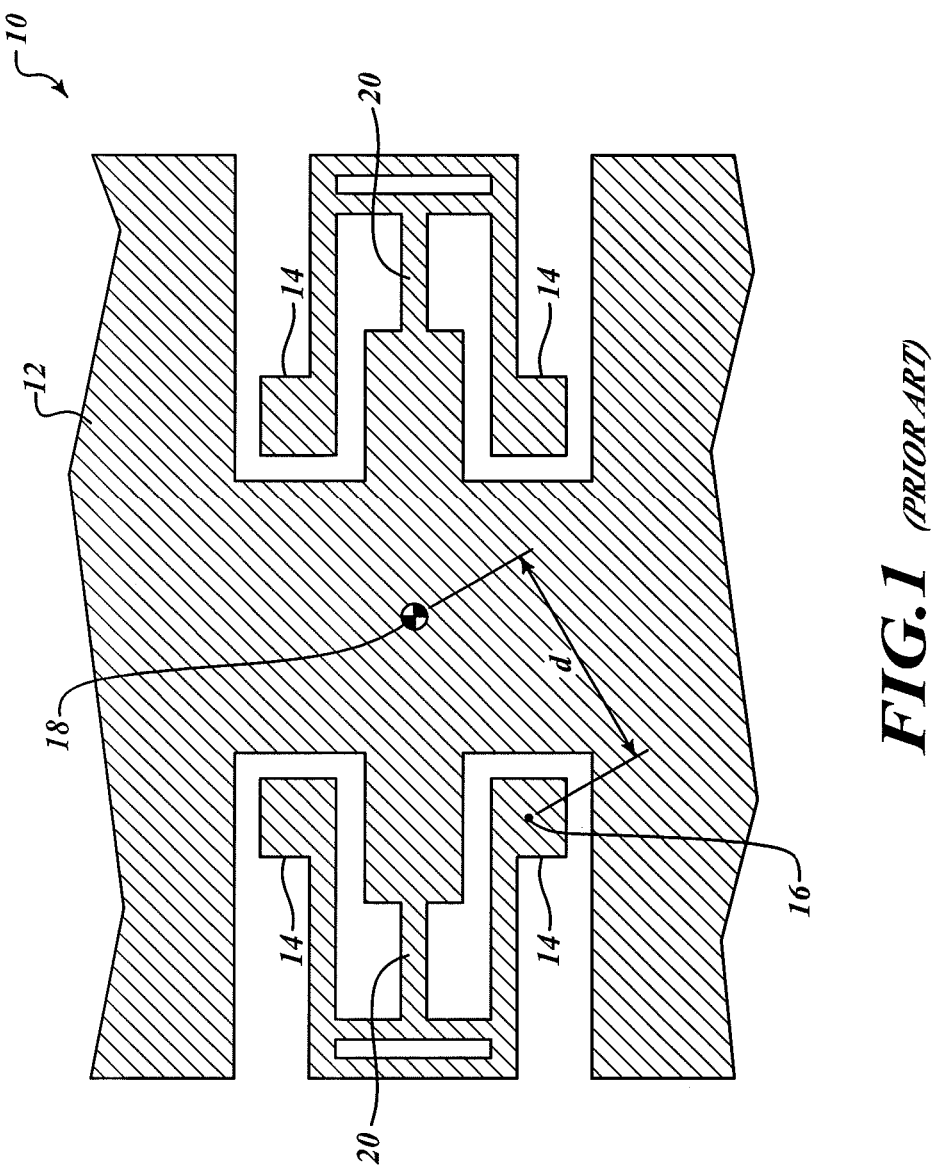
FIG. 1 is a prior-art, plan view of a mounting system utilized in a MEMS device for mounting a proof mass to an active MEMS sensing element.

In the illustrated embodiment, the single mounting anchor 104 includes a continuous perimeter or periphery 112 that surrounds a mid-point 114. A distance "d2" is defined as the distance from the mid-point 114 to a furthest portion of the periphery 112. The single mounting anchor 104 may have a variety of area profiles, such as square, rectangular, circular, elliptical, or some other type of profile. As such, the distance "d2" may be a uniform distance, for example if the periphery 112 is circular. In any event, the distance "d2" or separation distance is significantly reduced compared to the conventional mounting shown in FIG. 1 and described above in the background section. In addition, the single mounting anchor 104 is centrally positioned on the proof mass 102 relative to a centerline, which advantageously permits anchor mount variances to be manifested or distributed much more equally among the pair of hinges 108.

By way of example, the position and arrangement of the mounting anchor 104 may reduce the likelihood of asymmetric strains or dislocations at the anchor bond or periphery 112 from causing unequal deflections or stiffness of the hinges 108. For example, as the stiffness of each respective hinge 108 changes relative to the other hinge 108, the amount of load transferred through the hinges 108 may also vary, hence resulting in non-ideal motional characteristics of the proof mass. This may be referred to as an asymmetric load path, which again may be reduced or prevented based on the position and arrangement of the mounting anchor 104.

The isolation cuts 106, 110 may be symmetrically located proximate the hinges 108 to limit the ability of strains at or near the anchor 104 to impart rotations or deflections to the flexures 108 and, subsequently, the proof mass 102. The isolation cuts 106, 110 may be scaled and optimized with a variety of patterns to provide a desired amount of strain isolation between the substrate and the proof mass 102. The isolation cuts 106, 110 may extend completely through a thickness of the proof mass or may extend only partially through.

In one embodiment, the mounting anchor 104 may be micro-machined in an epitaxial silicon element (e.g., the proof mass 102) using a reactive ion etching process and then attached to a glass substrate (not shown) using anodic bonding techniques applied to the single mounting anchor 104. An electrical signal to the silicon element is connected to the proof mass 102 through the single mounting anchor 104 via metalized traces located on the glass substrate. Additional electrical signals may be distributed through other metalized traces located on the glass substrate to capacitor plates (not shown), which may be located below the silicon element or as located for the proper operation of the MEMS device.

While one embodiment of the invention has been illustrated and described, as noted above, many changes can be made without departing from the spirit and scope of the invention. Accordingly, the scope of the invention is not limited by the disclosure of one embodiment. Instead, the invention should be determined entirely by reference to the claims that follow.

The embodiments of the invention in which an exclusive property or privilege is claimed are defined as follows:

1. A mounting system for providing torsional and flexural suspension of a MEMS device, the mounting system comprising:
    a proof mass;
    a plurality of isolation cuts selectively arranged in the proof mass; and
    an anchor mounting member having a first surface bonded to a proof mass and a second surface bonded to a substrate, the anchor mounting member centrally located relative to a centerline of the proof mass,
    wherein the anchor mounting member does not extend beyond a border of the proof mass.

2. The mounting system of claim 1, wherein the isolation cuts are arranged to achieve a desired torsional stiffness of the proof mass proximate the anchor mounting member.

3. The mounting system of claim 1, wherein the isolation cuts are arranged to achieve desired strain isolation characteristics between the substrate and proof mass.

4. The mounting system of claim 1, wherein the isolation cuts are arranged to achieve a desired flexural stiffness of the proof mass proximate the anchor mounting member.

5. The mounting system of claim 1, wherein the isolation cuts are openings that extend only partially through the proof mass.

6. The mounting system of claim 1, wherein the isolation cuts are arranged to be symmetric about two orthogonal axes.

7. The mounting system of claim 1, wherein the anchor mounting member operates as a unitary mounting system between the substrate and the proof mass.

8. The mounting system of claim 1, wherein the anchor mounting member is a continuous, one-piece member.

9. The mounting system of claim 1, wherein the anchor mounting member includes an anodic bonding material.

10. A mounting system for providing torsional and flexural suspension of a MEMS device, the mounting system comprising:
    a proof mass;
    a plurality of isolation cuts selectively arranged in the proof mass; and
    a one-piece anchor mounting member having a first portion coupled to a substrate and a second portion coupled to the proof mass,
    wherein the anchor mounting member does not extend beyond a border of the proof mass.

11. The mounting system of claim 10, wherein the isolation cuts are arranged to achieve a desired torsional stiffness of the proof mass proximate the anchor mounting member.

12. The mounting system of claim 10, wherein the isolation cuts are arranged to achieve optimum strain isolation characteristics between the substrate and proof mass.

13. The mounting system of claim 10, wherein the isolation cuts are arranged to achieve a desired flexural stiffness of the proof mass proximate the anchor mounting member.

14. The mounting system of claim 10, wherein the isolation cuts are openings that extend only partially through the proof mass.

15. The mounting system of claim 10, wherein the isolation cuts are arranged to be symmetric about two orthogonal axes.

16. The mounting system of claim 10, wherein the anchor mounting member is symmetrically located with respect to the isolation cuts and the proof mass.

17. The mounting system of claim 10, wherein a separation distance between selected points of the anchor mounting member is minimized to reduce an amount of thermal strain within the mounting system.

18. The mounting system of claim 10, wherein the anchor mounting member is centrally located relative to a perimeter of the proof mass.

19. A MEMS device comprising:
    a sensor element;
    a proof mass;
    a plurality of isolation cuts selectively arranged in the proof mass; and
    an anchor mounting member having a first surface bonded to a substrate and a second surface bonded to the proof mass, the anchor mounting member centrally located relative to a centerline of the proof mass,
    wherein the anchor mounting member does not extend beyond a border of the proof mass.

20. The MEMS device of claim 19, wherein the anchor mounting member operates as a unitary mounting system between the substrate and the proof mass.

21. The MEMS device of claim 19, wherein the anchor mounting member is a continuous, one-piece member.

22. The MEMS device of claim 19, wherein the isolation cuts are arranged to produce hinges extending from proximate the anchor mounting member toward free edges of the proof mass.

* * * * *